United States Patent
Djelassi-Tscheck et al.

(10) Patent No.: US 12,292,469 B2
(45) Date of Patent: May 6, 2025

(54) CURRENT MEASURING CIRCUIT

(71) Applicant: Infineon Technologies AG, Neubiberg (DE)

(72) Inventors: Christian Djelassi-Tscheck, Villach (AT); Cristian Mihai Boianceanu, Bucharest (RO); Michael Nelhiebel, Villach (AT)

(73) Assignee: Infineon Technologies AG, Neubiberg (DE)

( * ) Notice: Subject to any disclaimer, the term of this patent is extended or adjusted under 35 U.S.C. 154(b) by 193 days.

(21) Appl. No.: 18/061,168

(22) Filed: Dec. 2, 2022

(65) Prior Publication Data
US 2023/0194595 A1 Jun. 22, 2023

(30) Foreign Application Priority Data

Dec. 21, 2021 (DE) .......................... 102021134029.2

(51) Int. Cl.
*G01R 31/28* (2006.01)
(52) U.S. Cl.
CPC ..... *G01R 31/2879* (2013.01); *G01R 31/2856* (2013.01)
(58) Field of Classification Search
CPC ............ G01R 31/2879; G01R 31/2856; G01R 19/16519; G01R 1/203; G01R 19/00; G01R 19/25; G01R 27/02
See application file for complete search history.

(56) References Cited

U.S. PATENT DOCUMENTS

| | | | | |
|---|---|---|---|---|
| 10,690,703 | B2* | 6/2020 | Choi | H02J 50/10 |
| 2007/0114662 | A1* | 5/2007 | Helneder | H01L 24/05 |
| | | | | 257/737 |
| 2008/0094266 | A1* | 4/2008 | Lukoff | H03M 1/1019 |
| | | | | 341/155 |
| 2008/0142979 | A1* | 6/2008 | Lin | H01L 24/13 |
| | | | | 257/E23.152 |
| 2017/0090494 | A1* | 3/2017 | Cui | G05F 1/562 |
| 2017/0117721 | A1* | 4/2017 | Toya | H02J 7/0016 |
| 2020/0303326 | A1* | 9/2020 | Zeng | H01L 24/04 |

(Continued)

FOREIGN PATENT DOCUMENTS

| | | |
|---|---|---|
| DE | 102008059853 A1 | 6/2010 |
| DE | 102011076651 A1 | 12/2011 |
| DE | 112018002579 T5 | 3/2020 |

*Primary Examiner* — Jermele M Hollington
*Assistant Examiner* — Zannatul Ferdous
(74) *Attorney, Agent, or Firm* — Slater Matsil, LLP

(57) ABSTRACT

A circuit includes a power transistor having a main current path between a first supply node and an output pin for connecting a load. A resistance formed by a chip metallization is arranged between the main current path of the power transistor and the output pin. The circuit includes a current measuring circuit coupled to the power transistor and including a sense transistor coupled to the power transistor. The current measuring circuit delivers a measurement current representing a load current flowing through the power transistor. An amplifier circuit generates an amplifier output signal representing the voltage across the resistance, and a control circuit outputs a signal representing the measurement current in a first mode and a signal dependent on the amplifier output signal in a second mode.

20 Claims, 5 Drawing Sheets

(56) References Cited

U.S. PATENT DOCUMENTS

| | | |
|---|---|---|
| 2020/0366199 A1 | 11/2020 | Ikeda |
| 2021/0065478 A1* | 3/2021 | Uehara ................... G06F 8/66 |
| 2022/0149797 A1* | 5/2022 | Goodchild ............. H02J 50/12 |

* cited by examiner

CURRENT MEASURING CIRCUIT

CROSS-REFERENCE TO RELATED APPLICATIONS

This application claims the benefit of German Patent Application No. 102021134029.2, filed on Dec. 21, 2021, which application is hereby incorporated herein by reference.

TECHNICAL FIELD

This description relates to a current measuring circuit, in particular a so-called sense transistor circuit, which is able to identify a degradation of the circuit.

BACKGROUND

One concept for current measurement that is often used in association with power transistors consists in the use of a so-called sense transistor. A power transistor (for example a DMOS transistor) usually consists of a multiplicity of transistor cells connected in parallel (transistor cell array). However, some transistor cells of the cell array form a separate transistor (the sense transistor). Said sense transistor is operated at the same operating point as the power transistor, but has a significantly smaller active area than the power transistor. The currents flowing through power transistor and sense transistor are approximately proportional in such an arrangement, the proportionality factor K corresponding (at least theoretically) to the ratio of the active areas of the two transistors. That is to say that the active area of the sense transistor is smaller than the active area of the power transistor by the factor K.

In the course of operation, the semiconductor chip, which contains the power transistor, is exposed to changing thermal loading, which over time can lead to the degradation of the semiconductor chip and ultimately to the failure of the semiconductor chip. There are concepts for semiconductor chips which can carry out a so-called "health check" using integrated means. However, these concepts are generally restricted to specific applications (e.g., switching converters) or they do not identify a problem until it is too late to still ensure reliable operation (fail operational).

The inventors have addressed the problem of developing an improved current measuring circuit which is able to identify a problematic degradation as early as possible.

SUMMARY

The stated problem is solved by means of the circuit as claimed in claim 1. Various exemplary embodiments and further developments are the subject matter of the dependent claims.

A circuit is described which, in accordance with one exemplary embodiment, comprises a power transistor having a main current path connected between a first supply node and an output pin for connecting a load. A resistance formed (inter alia) by a chip metallization is arranged between the main current path of the power transistor and the output pin. The circuit furthermore includes a current measuring circuit coupled to the power transistor and comprising a sense transistor coupled to the power transistor. The current measuring circuit is configured to deliver a measurement current representing a load current flowing through the power transistor. An amplifier circuit is configured to generate an amplifier output signal representing the voltage across the resistance, and a control circuit is configured, by means of electronic switches, to output a signal representing the measurement current in a first mode and a signal dependent on the amplifier output signal in a second mode.

A further exemplary embodiment relates to a method comprising the following: providing a measurement current by means of a current measuring circuit comprising a sense transistor coupled to a power transistor, and outputting the signal representing the measurement current in a first mode of an integrated circuit containing the power transistor and the sense transistor. The method furthermore comprises amplifying a voltage across a resistance arranged between a main current path of the power transistor and an output pin and formed (inter alia) by a chip metallization, and also outputting a signal representing the amplified voltage in a second mode of the integrated circuit.

BRIEF DESCRIPTION OF THE DRAWINGS

Exemplary embodiments are explained in greater detail below with reference to drawings. The illustrations are not necessarily true to scale and the exemplary embodiments are not restricted only to the aspects illustrated. Rather, importance is attached to illustrating the principles underlying the exemplary embodiments. With regard to the drawings.

DETAILED DESCRIPTION OF ILLUSTRATIVE EMBODIMENTS

Figure 1:
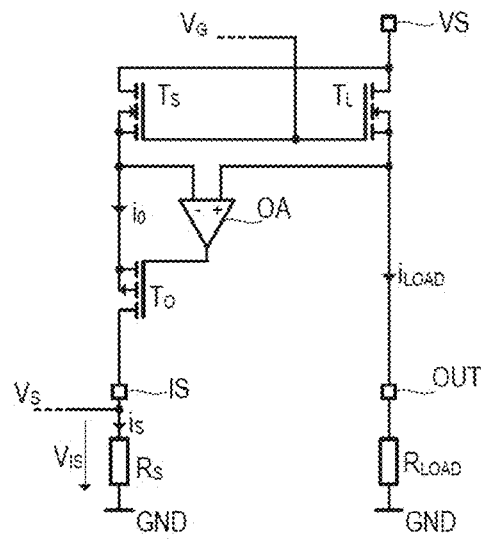
FIG. 1 illustrates one example of a current measuring circuit which uses a sense transistor for current measurement.

FIG. 1 shows one exemplary implementation of a current measuring circuit comprising a sense transistor. In the example illustrated, an electrical load $R_{LOAD}$ is switched with the aid of a power transistor $T_L$. The current flowing through the power transistor $T_L$ and hence also through the load $R_{LOAD}$ is designated by $i_{LOAD}$. The power transistor $T_L$ is embodied as a high-side switch. That is to say that the main current path of the power transistor $T_L$ (drain-source current path in the case of a MOS transistor) is connected between a supply terminal VS and an output (output pin OUT), to which the load $R_{LOAD}$ can be connected.

A current measuring circuit, comprising a sense transistor $T_S$ coupled to the power transistor $T_L$, is coupled to the power transistor $T_L$. The current measuring circuit is configured to deliver a measurement current $i_0$ representing the load current $i_{LOAD}$ flowing through the power transistor $T_L$. As mentioned in the introduction, the measurement current $i_0$ is approximately proportional to the load current $i_{LOAD}$, i.e. $i_0=i_{LOAD}/K$ (proportionality factor K). For a current measurement, the transistors $T_S$ and $T_L$ must have a similar characteristic and be operated (approximately) at the same operating point. Therefore, the gate electrodes of the two transistors $T_L$ and $T_S$ are connected to one another. Likewise the drain electrodes. Moreover, the drain electrodes of the transistors $T_L$ and $T_S$ are connected to the supply terminal VS, at which a supply voltage $V_S$ is present during operation. In order that both transistors $T_L$ and $T_S$ are operated at the same operating point, the drain-source voltages at both transistors $T_L$ and $T_S$ must also be identical, in an embodiment. This is achieved with the aid of the operational amplifier OA and the further transistor $T_0$ which together ensure that the source voltage at the sense transistor $T_S$ is regulated to the same value as the source voltage at the power transistor $T_L$. This is just one example, however. The operational amplifier is not absolutely necessary, Further concepts are also known for ensuring the (approximate) proportionality between measurement current $i_0$ and load current $i_{LOAD}$. The concrete implementation will depend on the requirements of the application.

In the example from FIG. 1, the sense transistor $T_S$ and the further transistor $T_0$ are connected in series, i.e. their drain-source current paths are connected in series and the same measurement current $i_0$ flows through both transistors $T_S$ and $T_0$. In the example illustrated, the transistor $T_0$ is a p-channel transistor, whereas the transistors $T_S$ and $T_L$ are n-channel transistors. The gate of the transistor $T_0$ is driven by the output signal of the operational amplifier OA, the inputs of the operational amplifier OA being connected to the source electrodes of the transistors $T_S$ and $T_L$. It goes without saying that the same circuit can also be constructed with a p-channel transistor as power transistor (and sense transistor).

The operational amplifier OA comprises a feedback loop with the transistor $T_0$. The inverting input of the operational amplifier OA is connected to the source electrode of the sense transistor $T_S$, and the noninverting input of the operational amplifier OA is connected to the source electrode of the power transistor $T_L$. If the source voltage at the sense transistor $T_S$ is less than the source voltage at the power transistor $T_L$, then the voltage at the output of the operational amplifier OA rises, as a result of which the gate-source voltage at the transistor $T_0$ becomes smaller, which has the effect that the on resistance of the transistor $T_0$ rises. The feedback loop of the operational amplifier OA is stable and, consequently, the operational amplifier OA drives the transistor $T_0$ such that the voltages at the source electrodes of the transistors $T_L$ and $T_S$ are substantially identical, i.e. differences in the drain-source voltages of power transistor and sense transistor are compensated for. As a result, sense transistor and power transistor operate substantially at the same operating point.

In the example illustrated, the measurement current $i_0$ is output at a sense pin IS. The current that is output is designated $i_S$ in FIG. 1 ($i_S=i_0$ in the example from FIG. 1). A measuring resistor $R_S$ can be connected to the sense pin IS. The measuring resistor $R_S$ is usually connected between the sense pin IS and a reference voltage (e.g. ground potential, 0 V). The resulting voltage $V_S$ at the sense pin IS is then equal to the product of measurement current $i_S$ and resistance $R_S$ ($V_{IS}=R_S \cdot i_S=i_{LOAD} \cdot R_S/K$).

Figure 2:
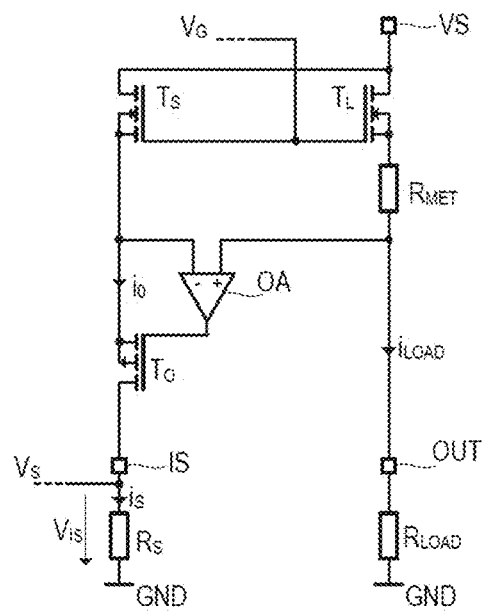
FIG. 2 illustrates the example from FIG. 1 with additional illustration of the resistance of the chip metallization.

FIG. 2 illustrates the same circuit as from FIG. 1 with the sole difference that a resistance $R_{MET}$ is depicted between the source electrode of the power transistor $T_L$ and the output pin OUT. Said resistance $R_{MET}$ is formed by the chip metallization, inter alia, and may thus be regarded as parasitic resistance. The resistances of the interconnects (e.g. vias/plated-through holes connecting different metallization layers) also contribute to the resistance $R_{MET}$. The resistance $R_{MET}$ is a lateral resistance, i.e. the current through the resistance $R_{MET}$ passes substantially in a lateral direction (i.e. substantially parallel to the chip surface), whereas the transistors $T_L$ and $T_S$ are vertical transistors (see also FIG. 4), in which the current flows substantially "from top to bottom", that is to say perpendicularly to the chip surface, through the transistor cell array.

Figure 3:
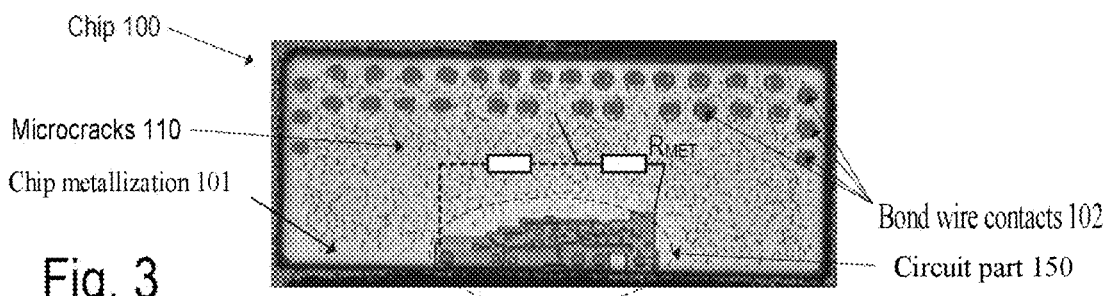
FIG. 3 is an image, recorded by means of a microscope, of the surface of a semiconductor chip into which the circuit from FIG. 2 is integrated.

FIG. 3 shows an enlarged image (photograph), taken by means of a microscope, of the semiconductor chip 100 containing the circuit from FIG. 2. The image of the semiconductor chip reveals the chip metallization 101 covering the majority of the chip surface. Furthermore, FIG. 3 reveals contact locations 102 for bond wires connecting the chip metallization 101 to the output pin OUT of the chip 100. The output pin OUT itself cannot be seen in FIG. 3 because it is usually arranged on a leadframe on which the chip 100 is mounted.

Furthermore, FIG. 3 reveals a circuit part 150 including the majority of the circuits required for driving and for operating the power transistor $T_L$ and for the current measurement by means of the sense transistor. The power and sense transistors can be embodied as vertical transistors and be formed by a multiplicity of transistor cells of a cell array. In the case of vertical transistors, the drain-source current path runs from the top side of the semiconductor chip (visible in FIG. 3), through the chip to the underside of the chip. In the example illustrated in FIG. 3, the chip metallization forming the drain electrode of the transistors $T_S$ and $T_L$ is situated on the underside of the chip, whereas the chip metallization 101 (see FIG. 3) of the source electrode is arranged on the top side.

A schematic illustration of the resistance $R_{MET}$ is superimposed on the image of the semiconductor chip 100. At this point it is important to understand that said resistance $R_{MET}$ is not a specific component embodied (locally) at a specific location, rather the resistance runs in a lateral direction and is distributed over the entire chip metallization 101 (depending on what current density field forms in the metallization during operation). The chip metallization 101 can be contacted/"tapped" at a plurality of locations. In the example illustrated in FIG. 3, one contact of the resistance $R_{MET}$ is situated in direct proximity to one of the chip contact locations 102 and a further contact is situated in the vicinity of the circuit part 150, in which for example the operational amplifier OA (or the control circuit 10, see FIG. 6) is also arranged. The layer thickness of the chip metallization can be in the range of approximately 2-50 μm. The contacts of the resistance $R_{MET}$ are situated at a distance of less than three layer thicknesses away from a chip contact location 102 and the circuit part 150, respectively. The two contacts of the resistance $R_{MET}$ are at at least a distance of five layer thicknesses. The chip contact locations 102 are for example those locations at which bond wires are connected to the chip metallization (e.g. by means of a wire bonding process). In other exemplary embodiments, clips, ribbons (ribbon bonding) or the like can also be used instead of bond wires. The geometry of the chip contact locations 102 can be different depending on the connection technique used.

The chip metallization 101 can be contacted at a plurality of locations. In the example illustrated in FIG. 3, a further contact is illustrated (on the left) in the vicinity of the circuit part 150. The resistance $R_{MET}$ can then be conceived of in terms of modeling as an electrical parallel connection of two resistances. The resistance value $R_{MET}$ then represents an average value of different local current paths through the chip metallization 101.

As already mentioned, the semiconductor chip—and also the chip metallization 101—experiences a multiplicity of temperature cycles in the course of operation of the integrated circuit. The temperatures may fluctuate more or less regularly, between room temperature and 300° Celsius, for example, during operation. Cyclic temperature fluctuations of more than 200° Celsius are not unusual. The inventors have established that these temperature fluctuations gradually result in microcracks 110 in the chip metallization 101, and the resistance value $R_{MET}$ gradually increases on account of the increasing number of microcracks. It was furthermore established that during regular monitoring of the resistance value $R_{MET}$, in the case of a specific change in the resistance value $R_{MET}$ (e.g. a rise by 200%), a failure of the semiconductor chip became increasingly likely. Monitoring of the resistance value $R_{MET}$ therefore allows a prediction that the semiconductor chip is approaching its end of life before the chip actually fails. In the case of safety-critical applications such as e.g. in the case of certain components of autonomously driving vehicles, such a prediction may be a crucial advantage for avoiding greater damage.

Figure 4:
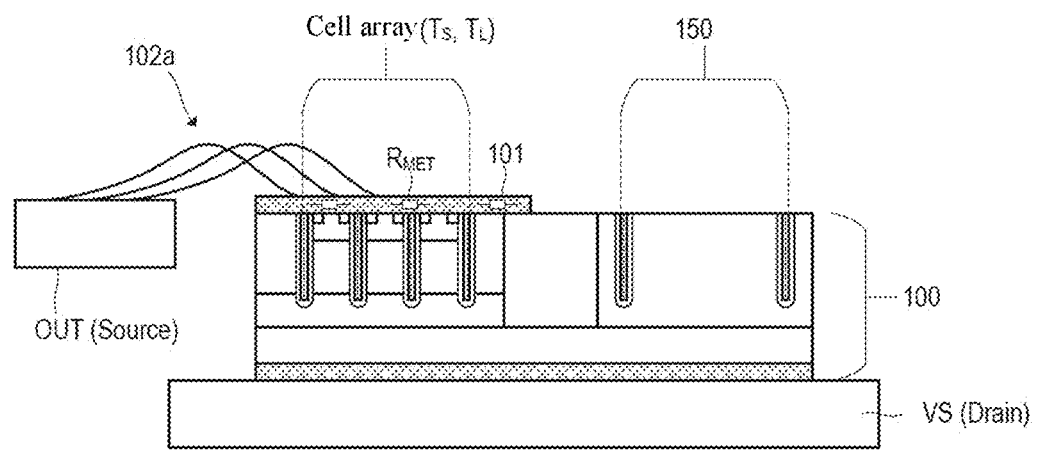
FIG. 4 is a schematic cross-sectional illustration through a semiconductor chip.

FIG. 4 is a schematic cross-sectional illustration through the semiconductor chip from FIG. 3. It goes without saying that the illustration in FIG. 4 is not true to scale and only the aspects necessary for understanding the exemplary embodiments are illustrated and will be discussed below. The structure of such a semiconductor chip is known per se to a person skilled in the art.

A transistor cell array integrated in the semiconductor chip 100 is illustrated schematically on the left-hand side of FIG. 4. The example illustrated involves vertical DMOS transistors $T_S$ and $T_L$. The drain electrode is formed by the metallization no at the underside of the chip. The source electrode is formed by the metallization 101 at the top side of the chip 100. The underside metallization no is mounted on a leadframe by means of die bonding. The top-side metallization 101 is connected to the associated chip pin OUT of the leadframe by means of wire bonding. The resistance of the metallization 101 is schematically symbolized by the resistance $R_{MET}$ (cf. also FIG. 3). The circuit part 150 containing most of the other circuit components is situated on the right-hand side of FIG. 4. The resistance $R_{MET}$ formed by the chip metallization is formed in particular by that part of the metallization which is exposed to thermal loading during operation of the power transistor $T_L$ and degrades on account of this (cyclic) thermal loading.

Figure 5:
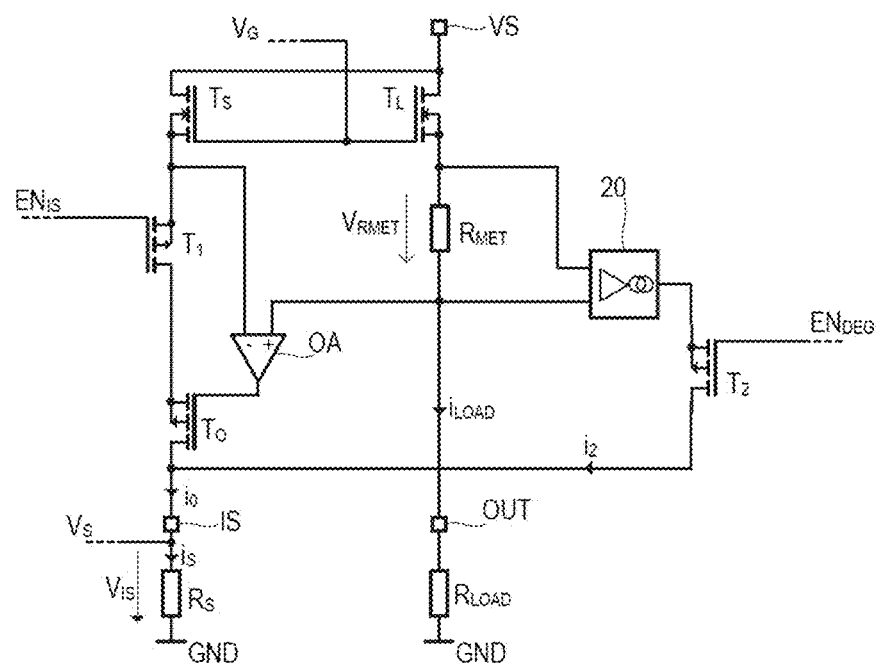
FIG. 5 illustrates a circuit in accordance with a first exemplary embodiment.

FIG. 5 illustrates an improved current measuring circuit which makes it possible to measure the resistance $R_{MET}$ in a simple manner. As mentioned, the resistance value $R_{MET}$ can deliver an indication of the degradation of the semiconductor chip. The circuit in FIG. 5 is a further development of the circuit from FIG. 2. For this reason, only those additional components in FIG. 5 which are not contained in FIG. 2 will be discussed in greater detail below. For the rest, explanations above concerning FIG. 2 also apply to the example from FIG. 5.

Power transistor $T_L$, sense transistor $T_S$ and the resistance $R_{MET}$ are practically the same as in FIG. 2. In addition, however, provision is made of an amplifier 20 configured to amplify the voltage drop $V_{RMET}$ across the resistance $R_{MET}$. In the present example, the amplifier is a transconductance amplifier which delivers an output current $i_2$ that is dependent on the input voltage $V_{RMET}$. In the present example, it holds true that $i_2 = G \cdot V_{RMET}$, where G denotes the gain (transconductance) of the amplifier 20. In the example illustrated, the output of the amplifier 20 is connected to the sense pin IS via an electronic switch (e.g. transistor $T_2$). Said electronic switch can be switched on and off in accordance with the logic signal $EN_{DEG}$. In the example illustrated, the signal $EN_{DEG}$ is fed to the gate electrode of the transistor $T_2$.

A further electronic switch (e.g. transistor $T_1$) is arranged between the source electrode of the sense transistor $T_S$ and the further transistor $T_0$. Said electronic switch can be switched on and off in accordance with the logic signal $EN_{IS}$. In the example illustrated, the signal $EN_{IS}$ is fed to the gate electrode of the transistor $T_1$. The transistor $T_1$ essentially has the purpose of deactivating the current measurement by means of the sense transistor $T_S$ (temporarily, depending on the operating mode of the circuit). The signals $EN_{IS}$ and $EN_{DEG}$ can be generated e.g. via a control logic (see also FIGS. 6 and 8).

In a first operating mode (current measurement mode), the transistor $T_1$ is switched on and the transistor $T_2$ is switched off. In this case, the output of the differential amplifier 20 is disconnected from the sense pin IS and the circuit operates substantially identically to the circuit from FIG. 2. That is to say that the operational amplifier OA drives the transistor $T_0$ and thus regulates the source voltage of the sense transistor in such a way that the sense transistor $T_S$ is operated substantially at the same operating point as the power transistor $T_L$. The current $i_0$ that flows through the transistors $T_S$, $T_1$ and $T_0$ is output as measurement current $i_S$ at the sense pin IS and, across the resistance $R_S$ connected to the sense pin, generates the voltage drop $V_{IS} = i_0 \cdot R_S = i_{LOAD} \cdot R_S / K$.

In a second operating mode (resistance measuring mode), the transistor $T_1$ is switched off (and the sense transistor $T_S$ is thus inactive) and the transistor $T_2$ is switched on. In this case, the output of the differential amplifier 20 is connected to the sense pin IS, and the output current $i_2$ of the differential amplifier 20 is output as measurement current $i_S$ at the sense pin IS and, across the resistance $R_S$ connected to the sense pin, generates the voltage drop $V_{IS} = i_2 \cdot R_S = G \cdot V_{RMET} \cdot R_S = G \cdot i_{LOAD} \cdot R_{MET} \cdot R_S$. The transconductance G here has the dimension current/voltage (A/V) or 1/resistance ($\Omega^{-1}$).

In order to measure the resistance $R_{MET}$, with the load switched on (i.e. power transistor $T_L$ is on), firstly the load current can be measured in the first mode. As mentioned, the associated measurement value $V_{S,1}$ is calculated in accordance with the equation $V_{IS,1} = i_{LOAD} \cdot R_S / K$. Afterward, a further measurement is carried out in the second mode. As mentioned, the associated measurement value $V_{S,2}$ is calculated in accordance with the equation $V_{IS,2} = G \cdot i_{LOAD} \cdot R_{MET} \cdot R_S$. The ratio $V_{IS,2}/V_{IS,1}$ of the two measurement values is equal to $G \cdot R_{MET} \cdot K$, and the resistance $R_{MET}$ sought is calculated from the two measurement values as follows:

$$R_{MET} = (V_{IS,2}/V_{IS,1})/(K \cdot G). \tag{1}$$

In one exemplary embodiment, the measurement values $V_{S,2}$ and $V_{S,1}$ are digitized for example by an external controller connected to the sense pin IS. The resistance value sought can then be calculated by means of an arithmetic logic unit (ALU, Arithmetic Logic Unit), a programmable processor, a hardwired computing circuit or the like (or a combination of the above options). Depending on the application, it is also not necessary to divide the ratio $V_{IS,2}/V_{IS,1}$ by the product $K \cdot G$. The information sought is actually already contained in the ratio $V_{IS,2}/V_{IS,1}$, wherein the parameter relevant to the assessment of the degradation of the semiconductor chip 100 is the change in the ratio $V_{IS,2}/V_{IS,1}$ or is dependent on the latter. By way of example, the ratio $V_{IS,2}/V_{IS,1}$ could be normalized to 1 for a new semiconductor chip.

Figure 6:
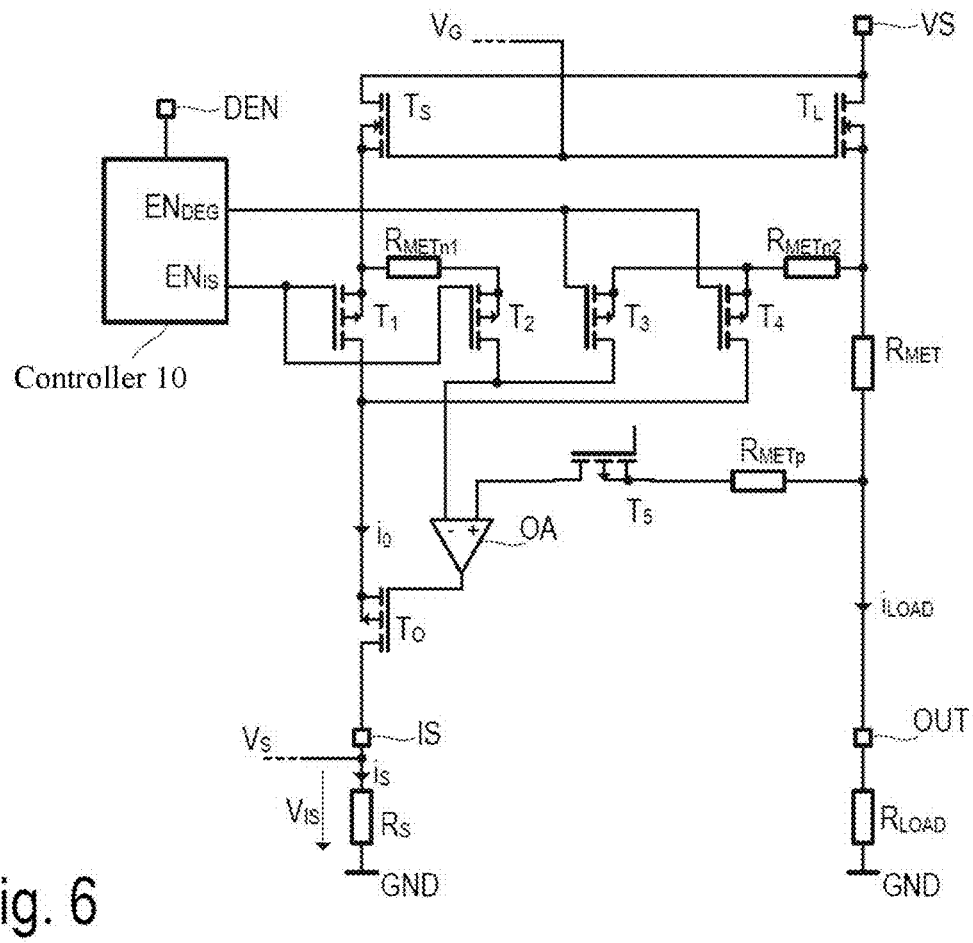
FIG. 6 illustrates a circuit in accordance with a further exemplary embodiment.
Figure 7A:
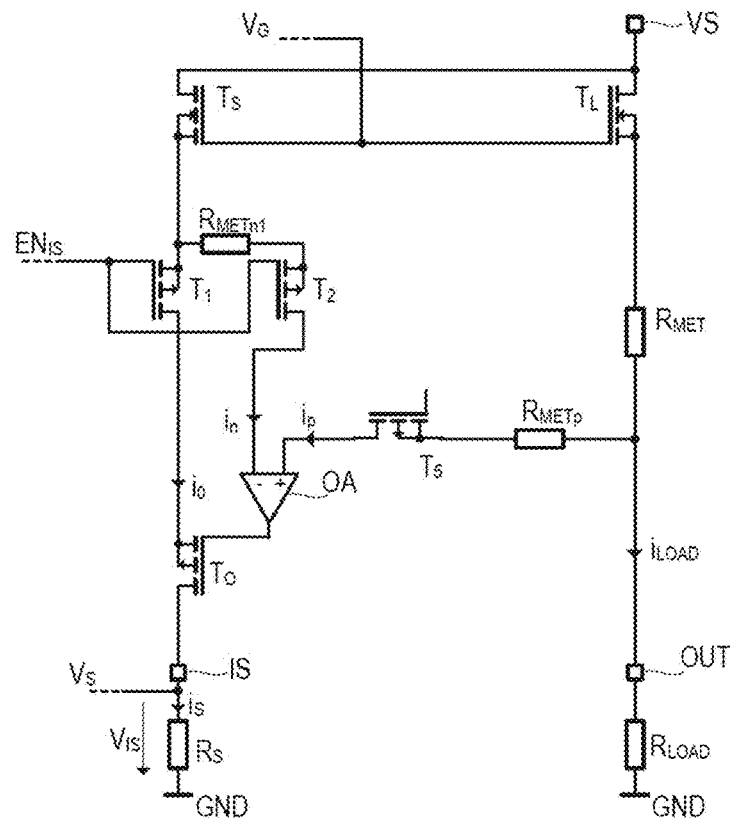
FIGS. 7A and 7B shows two equivalent circuit diagrams representing the circuit from FIG. 6 in the first and the second operating mode, respectively.
Figure 7B:
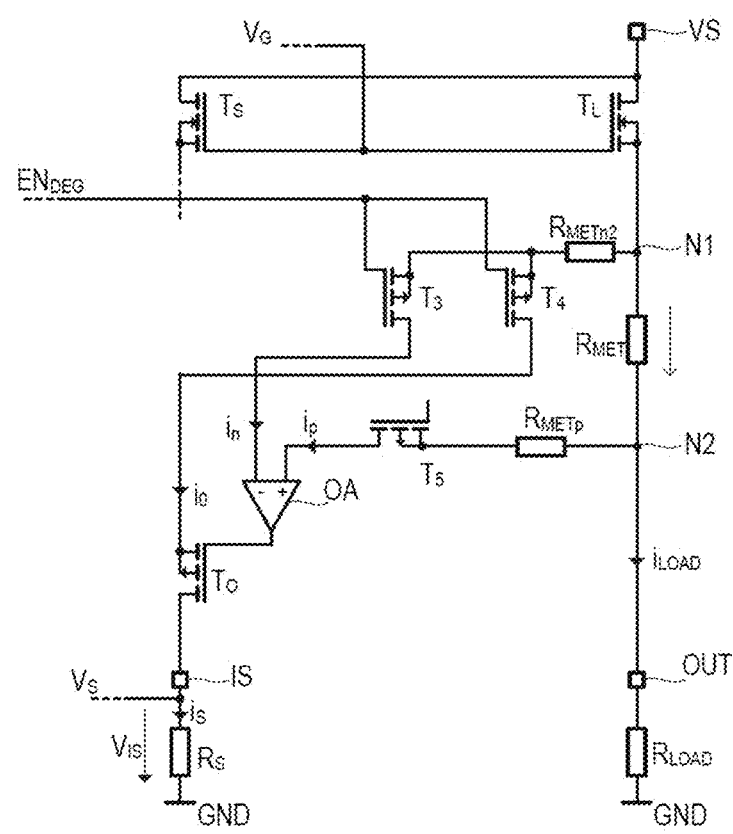

FIG. 6 shows a further example of a current measuring circuit which has substantially the same function as the circuit from FIG. 5, but is implemented somewhat differently. The circuit from FIG. 6 can likewise be operated in a first mode (current measuring mode) and a second mode (resistance measuring mode). FIG. 7A shows a simplified equivalent circuit of the example from FIG. 6 in the first mode, and FIG. 7B shows a simplified equivalent circuit of the example from FIG. 6 in the second mode. In the present example, the operational amplifier OA is used in the first mode and in the second mode. In the first mode, the circuit from FIG. 6 (and FIG. 7A) operates substantially the same as in the example from FIG. 5. In the second mode, the operational amplifier OA also performs the function of the differential amplifier (cf. FIG. 5, differential amplifier 20). The use of the same (operational) amplifier in both modes has the advantage that during the calculation of the ratio $V_{IS,2}/V_{IS,1}$ (see equation 1) possible errors that occur as a result of non-ideal properties of the operational amplifier at least partly cancel one another out. The resistance measurement becomes more accurate as a result.

In FIG. 6, the transistors $T_1$ to $T_4$ serve as electronic switches, with the aid of which the controller 10 (control logic) can reconfigure the topology of the circuit according to a selected operating mode. In the first operating mode (current measurement), the transistors $T_1$ and $T_2$ are on (logic signal $EN_{IS}$ has a low level) and the transistors $T_3$ and $T_4$ are off (logic signal $EN_{DEG}$ has a high level). The situation is reversed in the second operating mode. The transistor $T_5$ is optional and is always on in the present example. The transistor $T_5$ is used to achieve a better symmetry of the circuit. The controller can select the operating mode for example depending on a signal received at a diagnosis pin and can generate the logic signals $EN_{IS}$ and $EN_{DEG}$ accordingly.

FIG. 7A is a simplified equivalent circuit of the example from FIG. 6 for the first mode. Those current paths which are inactive on account of the transistors $T_3$ and $T_4$ that are switched off in the first mode have been omitted in FIG. 7A. The circuit from FIG. 7A operates very similarly to the circuit from FIG. 5 in the first mode. In accordance with FIG. 7A, the inverting input of the operational amplifier OA is connected to the source electrode of the sense transistor $T_S$ via the drain-source path of the (switched-on) transistor $T_2$ and the resistance $R_{METn1}$. Equally, the noninverting input of the operational amplifier OA is connected to the source electrode of the power transistor $T_L$ via the drain-source path of the (switched-on) transistor $T_5$ and the resistance $R_{METp}$ (and $R_{MET}$). The circuit is designed such that the on resistance $R_{ON,T}$ of the transistors $T_2$ and $T_5$ is identical and the resistance values $R_{METn1}$ and $R_{METp}$ are also identical. In this way, given non-negligible input currents $i_n$ and $i_p$ ($i_p \approx i_n$), no additional offset voltage is generated (because $(R_{METn1}+R_{ON,T}) \cdot i_n \approx (R_{METp}+R_{ON,T}) \cdot i_p$). In practice, operational amplifiers having FET input stages are often used, in which the input currents $i_n$ and $i_p$ are negligibly small. Nevertheless, in practice, a high symmetry of the circuit is taken into consideration in order to compensate for e.g. temperature drifts or similar effects and the like. As already discussed with regard to FIG. 2, the operational amplifier OA will drive the transistor $T_0$ (and thus set the conductivity of the transistor $T_0$) such that the source voltages of the transistors $T_S$ and $T_L$ are substantially identical. That means that power transistor $T_L$ and sense transistor $T_S$ operate at the same operating point. In this case, it also holds true that $i_S=i_0=i_{LOAD}/K$ and the voltage drop $V_{IS}=i_S \cdot R_S$ is proportional to the load current $i_{LOAD}$.

FIG. 7B is a simplified equivalent circuit of the example from FIG. 6 for the second mode. Those current paths which are inactive on account of the transistors $T_1$ and $T_2$ that are switched off in the second mode have been omitted in FIG. 7B. The circuit from FIG. 7B operates similarly to the circuit from FIG. 5 in the second mode, the amplifier 20 shown in FIG. 5 being implemented with the aid of the operational amplifier OA. The inverting input of the operational amplifier OA is connected to a first terminal of the resistance $R_{MET}$ via the drain-source path of the (switched-on) transistor $T_3$ and the resistance $R_{METn2}$ (circuit node N1). The noninverting input of the operational amplifier OA is connected to a second terminal of the resistance $R_{MET}$ via the drain-source path of the (switched-on) transistor $T_5$ and the resistance $R_{METp}$ (circuit node N2). The sense pin IS is connected to the circuit node N1 via the drain-source paths of the transistors $T_0$ and $T_4$ and also via the resistance $R_{METn2}$. Assuming that $(R_{METn1}+R_{ON,T}) \cdot i_n \approx (R_{METp}+R_{ON,T}) \cdot i_p$ (or given negligibly small input currents $i_p$, $i_n$), the offset voltages caused by the input currents $i_n$ and $i_p$ cancel one another out and the output current $i_S$ is calculated in accordance with the equation $$i_S = i_0 = V_{RMET}/R_{METn1} \qquad (2).$$

In this example, the effective transconductance of the differential amplifier circuit is $R_{METn1}^{-1}$. For the resistance measurement, the same explanation given further above with regard to FIG. 5 (cf. equation 1) applies to the example from FIGS. 6, 7A and 7B. The method carried out here for measuring the voltage across the resistance $R_{MET}$ is also referred to as four-conductor measurement (4 T sensing). The contacting of the resistance $R_{MET}$ is also called Kelvin contacting in this context.

The resistances $R_{METn1}$, $R_{METn2}$ and $R_{METp}$ are not necessarily resistance components integrated into the semiconductor chip, but rather can be formed by parts of the metallization layers of the semiconductor chip. The transistor $T_5$ that is always switched on essentially has the purpose of symmetrically connecting the operational amplifier to the circuit nodes N1 and N2. That is to say that the two inputs of the amplifier circuit have approximately the same input resistance $R_{METp}+R_{ON,T} \approx R_{METn1}+R_{ON,T}$. In some exemplary embodiments, the MOSFETs $T_S$, $T_L$ are separated from the drive electronics (gate drivers, etc.), i.e. the MOSFETs are arranged "externally" to the drive electronics in separate chip packages. In these cases, the resistances $R_{METn1}$, $R_{METn2}$ and $R_{METp}$ also include the resistance of the chip-external connections.

Figure 8:
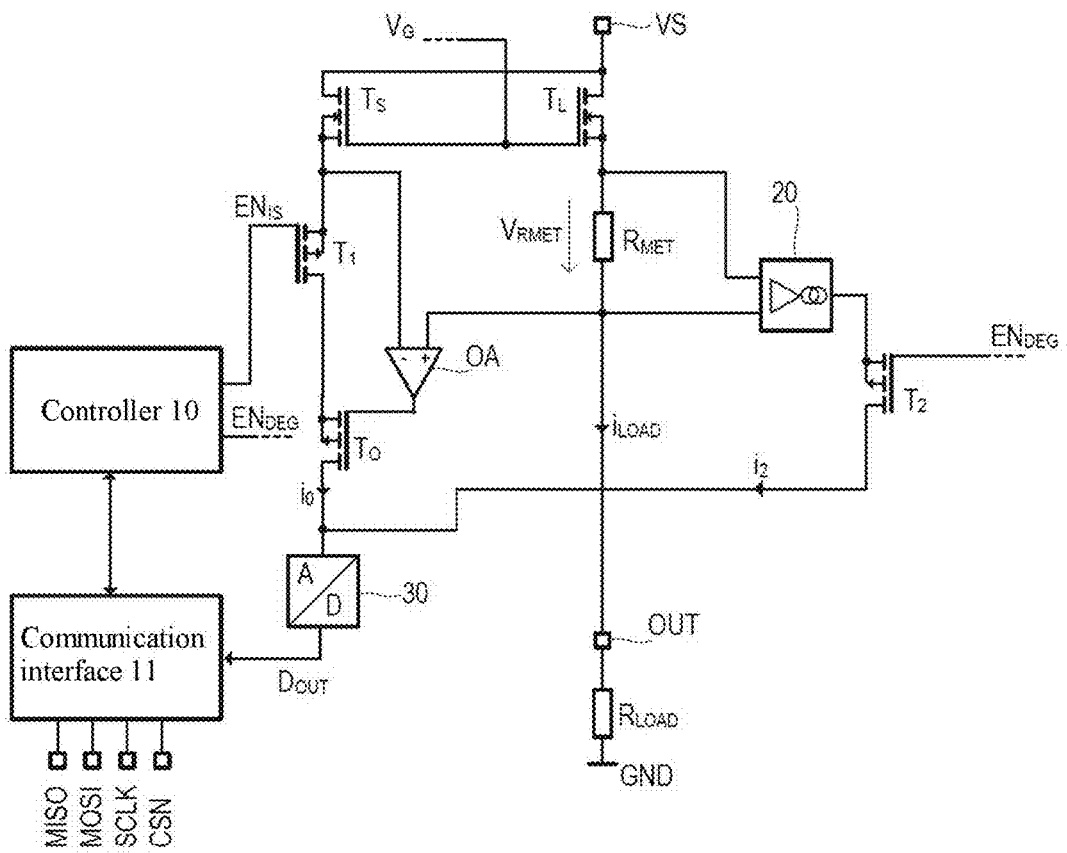
FIG. 8 illustrates a variant of the circuit from FIG. 5 with a communication interface for serial data transmission.

The sense pin IS is not necessarily a current output as in the examples described previously. In another exemplary embodiment, the resistor $R_S$ can also be integrated in the semiconductor chip 100 and the voltage $V_{IS}=R_S \cdot i_S$ can be output at the sense pin. FIG. 8 illustrates one variant of the circuit from FIG. 5 with a communication interface 30 for digital serial data transmission. The circuit from FIG. 8 is substantially identical to the circuit from FIG. 5, but the sense pin IS with the externally connected resistor $R_S$ has been replaced by an analog-to-digital converter 30 having a current input. Instead of outputting—depending on the operating mode—the current $i_0$ or $i_2$ at a sense pin, the current value is digitized with the aid of the analog-to-digital converter 30 and the corresponding digital value $D_{OUT}$ is fed to a communication interface 11.

The communication interface 11 can furthermore be connected to a controller (control logic 10, cf. FIG. 6), which generates the logic signals $EN_{IS}$ and $EN_{DEG}$, inter alia. The communication interface 11 can enable for example serial communication in accordance with a standardized serial interface, such as e.g. Serial Peripheral Interface (SPI). Of course, that is just one example and any other digital interface can also be used. Via the interface 11, the control logic 10 can also receive control commands, for example control commands that cause the control logic 10 to operate the circuit in the first mode (current measurement) or the second mode (resistance measurement).

In one exemplary embodiment, the control logic 10 can also be configured to switch over regularly between the first mode and the second mode and to determine and to store regularly updated digital values representing the ratio $V_{IS,2}/V_{IS,1}$ (cf. equation 1) and thus also the resistance value $R_{MET}$. The control logic can also be configured to respond to a query received via the communication interface 11 with a digital value representing the degradation of the semiconductor chip. Such a value could also be output in analog form, of course, in another exemplary embodiment.

One example of a method which can be carried out using the integrated circuits described here is summarized below with reference to the flow diagram from FIG. 9. In accordance with FIG. 9, the method comprises providing a measurement current (cf. FIGS. 5 and 7A, current $i_0$) by means of a current measuring circuit, comprising a sense transistor coupled to a power transistor (see FIG. 9, step S1). In a first operating mode (current measuring mode), a signal representing the measurement current is output (e.g. at the sense pin IS or via a digital interface) (see FIG. 9, step S2). The signal can be the measurement current $i_0$ itself, or else a digital representation of the measurement current $i_0$.

Figure 9:
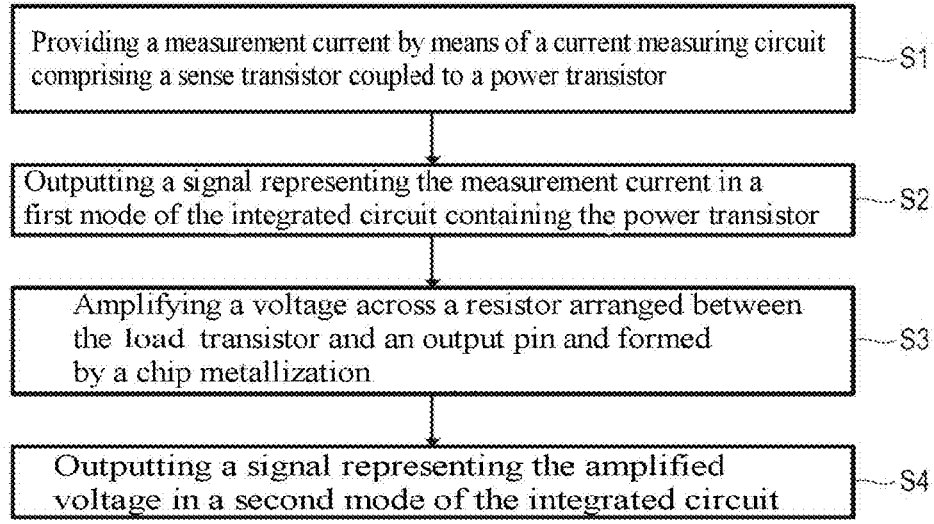
FIG. 9 is a flow diagram for illustrating one example of a method which can be carried out using the circuits described here.

The method furthermore comprises amplifying a voltage across a resistance (cf. FIGS. 5 and 7B, resistance $R_{MET}$ and voltage $V_{RMET}$) arranged between a main current path of the power transistor and an output pin and formed by a chip metallization (see also FIG. 3), and generating an output signal that is dependent on the amplified voltage (see FIG. 9, step S3). In a second mode, said output signal is output (see FIG. 9, step S4). Said output signal can represent the voltage $V_{RMET}$ across the resistance $R_{ME}$, the resistance value $R_{MET}$ or a variable representing the change in the resistance within a certain time period (e.g. since the first start-up of the semiconductor chip).

What is claimed is:

1. A circuit comprising:
a power transistor having a main current path connected between a first supply node and an output pin for connecting a load, wherein a resistance formed by a chip metallization is coupled in series between the main current path of the power transistor and the output pin;
a current measuring circuit coupled to the power transistor and comprising a sense transistor coupled to the power transistor, wherein the current measuring circuit is configured to deliver a measurement current representing a load current flowing through the power transistor;
an amplifier circuit configured to generate an amplifier output signal representing a voltage across the resistance; and
a control circuit configured, by electronic switches, to output a signal representing the measurement current in a first mode and a signal dependent on the amplifier output signal in a second mode.

2. The circuit as claimed in claim 1,
wherein the control circuit is configured to output the measurement current in the first mode and an output current of the amplifier circuit in the second mode.

3. The circuit as claimed in claim 1,
wherein the control circuit is configured, with a communication interface, to output a digital value representing the measurement current in the first mode and representing the voltage across the resistance or a resistance value of the resistance in the second mode.

4. The circuit as claimed in claim 1,
wherein the resistance formed by the chip metallization is not a locally embodied resistance, but rather is distributed over the chip metallization.

5. The circuit as claimed in claim 1,
wherein the resistance formed by the chip metallization is formed by that part of the metallization which, during operation of the power transistor, is exposed to thermal loading.

6. The circuit as claimed in claim 1,
wherein a first terminal of the resistance is arranged in a vicinity of a chip contact location and a second terminal of the resistance is arranged in a vicinity of the control circuit.

7. The circuit as claimed in claim 6,
wherein a distance between the first terminal of the resistance and a bond wire contact location is smaller than three layer thicknesses of the chip metallization, and
wherein a distance between the second terminal of the resistance and the control circuit is smaller than three layer thicknesses.

8. The circuit as claimed in claim 1,
wherein the chip metallization has a layer thickness of 2-50 μm.

9. The circuit as claimed in claim 1,
wherein the current measuring circuit comprises an output transistor coupled to the sense transistor such that substantially the measurement current flows through the sense transistor and the output transistor; and
wherein the current measuring circuit comprises an operational amplifier configured to drive the output transistor such that the power transistor and the sense transistor are operated substantially at the same operating point.

10. The circuit as claimed in claim 1,
wherein the current measuring circuit comprises an output transistor coupled to the sense transistor such that substantially the measurement current flows through the sense transistor and the output transistor; and
wherein the current measuring circuit comprises an operational amplifier configured to drive the output transistor such that the measurement current is substantially proportional to a load current through the power transistor.

11. The circuit as claimed in claim 9,
wherein the operational amplifier is part of the amplifier circuit in the second mode; and
wherein the control circuit is furthermore configured, in the second mode, to couple the operational amplifier to the resistance such that the operational amplifier amplifies the voltage across the resistance.

12. The circuit as claimed in claim 1,
wherein the control circuit is furthermore configured to receive a diagnosis signal via a communication connection and to switch to the first or the second mode depending on the diagnosis signal.

13. A method comprising:
providing a measurement current by a current measuring circuit comprising a sense transistor coupled to a power transistor,
outputting a signal representing the measurement current in a first mode of an integrated circuit containing the power transistor and the sense transistor;
amplifying a voltage across a resistance coupled in series between a main current path of the power transistor and an output pin coupled to a load, wherein the resistance is formed by a chip metallization, and the amplified voltage represents a voltage across the resistance; and
outputting a signal representing the amplified voltage in a second mode of the integrated circuit.

14. The method as claimed in claim 13,
wherein the measurement current is output at a sense pin in the first mode, and wherein a current representing the voltage across the resistance is output at the sense pin in the second mode.

15. The method as claimed in claim 13, furthermore comprising:
receiving a diagnosis signal via a communication connection; and
switching to the first or the second mode depending on the diagnosis signal.

16. The method as claimed in claim 13, furthermore comprising:
determining a first value representing the measurement current in the first mode; and
determining a second value representing the voltage across the resistance in the second mode, and
determining a measurement value representing the resistance based on the first and second values.

17. The method as claimed in claim 16,
wherein the measurement value indicates a degradation of the chip metallization.

18. An integrated circuit comprising:
a power transistor;
an output pin configured to be coupled to a load external to the integrated circuit;
a metallization resistance coupled between an output node of the power transistor and the output pin;
a sense transistor having a control node coupled to a control node of the power transistor;
an amplifier having a first input coupled to an output node of the sense transistor and a second input coupled to the output pin;
a first transistor having a control node coupled to an output of the amplifier and a first load path node coupled to the output node of the sense transistor;
a measurement resistor coupled to a second load path node of the first transistor;
a transconductance amplifier having inputs connected across the metallization resistance;
a first switch coupled between the output node of the sense transistor and the first load path node of the first transistor; and
a second switch coupled between an output node of the transconductance amplifier and the measurement resistor.

19. The circuit as claimed in claim 18, further comprising a control circuit configured to:
activate the first switch and deactivate the second switch during a first mode, wherein a current proportional to a current provided by the power transistor is configured to flow though the measurement resistor during the first mode; and
activate the second switch and deactivate the first switch during a second mode, wherein a current proportional to a voltage across the metallization resistance is configured to flow though the measurement resistor during the second mode.

20. The circuit of claim 18, wherein the power transistor, the sense transistor, the first transistor, the first switch and the second switch comprise metal oxide semiconductor transistors.

* * * * *